(12) United States Patent
Kim

(10) Patent No.: US 6,556,645 B2
(45) Date of Patent: Apr. 29, 2003

(54) MULTI-BIT COUNTER

(75) Inventor: Saeng-Hwan Kim, Ichon-shi (KR)

(73) Assignee: Hynix Semiconductor Inc., Kyungki-do (KR)

( * ) Notice: Subject to any disclaimer, the term of this patent is extended or adjusted under 35 U.S.C. 154(b) by 0 days.

(21) Appl. No.: 09/785,030

(22) Filed: Feb. 15, 2001

(65) Prior Publication Data

US 2002/0018539 A1 Feb. 14, 2002

(30) Foreign Application Priority Data

Feb. 18, 2000 (KR) .......................................... 2000-7848

(51) Int. Cl.[7] ................................................ G06M 3/00
(52) U.S. Cl. .............................. 377/51; 377/26; 377/107
(58) Field of Search ............................... 377/26, 51, 107

(56) References Cited

U.S. PATENT DOCUMENTS 5,561,674 A * 10/1996 Cho .............................. 377/56
6,314,155 B1 * 11/2001 Shona et al. .................. 377/26

* cited by examiner

Primary Examiner—Margaret R. Wambach
(74) Attorney, Agent, or Firm—Townsend and Townsend and Crew LLP

(57) ABSTRACT

A multi-bit counter of the present invention is capable of high-speed operation because the time needed for increasing count values and combining count bits for a carry can be minimized by presetting all bit combinations for a unit having multiple bits and selecting the preset combinations by a clock signal, i.e., by presetting the state of each of the bit combinations and outputting a next required value.

27 Claims, 8 Drawing Sheets

30

MULTI-BIT COUNTER

BACKGROUND OF THE INVENTION

The present invention relates to a multi-bit counter, and, more particularly, to a multi-bit counter capable of executing high speed operation by presetting all bit combinations for a unit having multiple bits and selecting the preset combinations by a clock signal.

FIG. 1 is a block diagram of a typical multi-bit counter, e.g., 6-bit counter. As shown in FIG. 1, the 6-bit counter comprises unit counters CNT1 to CNT6 for detecting an initial input value applied via external address signals EADD<0:5>. The external input can be set by a count set signal CNTSET, and a count increase signal CNTINC increments the count in combination with a carry CAi to output internal address signal IADD<0:5>, and first to fourth carry generators 1–4, each for combining the carry CAi and the internal address signal IADDi of the corresponding unit counter, for applying the combined signal to the carry CA(i+1) of the next unit counter.

Each of the carry generators 1–4 includes a NAND gate ND for NAND-operating the carry CA(i−1) of the previous unit counter CNT(i−1) and the internal address signal IADD (i−1) of the previous unit counter CNT(i−1), and an inverter INV for inverting the output of the NAND gate ND to output the carry CAi. Here, because a carry input port of the first unit counter CNT1 is coupled to a power voltage, the internal address signal IADD0 of the first unit counter is directly applied to the carry CA1 of the second unit counter CNT2.

The unit counter CNTi as shown in FIG. 2, includes a NAND gate ND1 for NAND-operating the carry CA(i−1) of the previous unit counter CNT(i−1) and the counter increase signal CNTINC to output an inverted increase control signal /INC; a first inverter INV1 for inverting the output of the NAND gate ND1 to an increase control signal INC; a second inverter INV2 for inverting the count set signal CNTSET; a third inverter INV3 for inverting the external address signal EADDi; a first transfer gate TG1 for selectively transferring the output of the third inverter INV3 under control of the count set signal CNTSET and the inverted count set signal /CNTSET; fourth and fifth inverters INV4, INV5, the input of the fourth inverter coupled to the output of the fifth inverter and the input of the fifth inverter coupled to the output of the fourth inverter latching the signal selectively transferred through a first transfer gate TG1; a sixth inverter INV6 for inverting the output signal of the fourth inverter INV4; seventh and eighth inverters INV7, INV8, the input of the seventh inverter coupled to the output of the eighth inverter and the input of the eighth inverter coupled to the output of the seventh inverter for latching the output signal of the sixth inverter INV6; and a second transfer gate TG2 for selectively transferring the signal transferred selectively through the first transfer gate TG1 under control of the increase control signal INC and the inverted increase control signal /ICN, wherein the output signal of the seventh inverter INV7 and the signal selectively transferred through the second transfer gate TG2 are coupled to generate the internal address signal IADDi.

Increase control signal INC is applied to the power ports of the fifth and sixth inverters INV5, INV6 and inverted increase control signal /INC is applied to the ground ports of the fifth and sixth inverters INV5, INV6. In addition, inverted increase control signal /INC is applied to the power port of eighth inverter INV8 and increase control signal INC is applied to the ground port of eighth inverter IVN8.

The conventional multi-bit counter as described above outputs an internal address signal and sets the internal state of each counter to prepare for generating the next internal address signal as directed by a clock signal. However, as the frequency of the clock signal increases, the margin of time required to compare and properly increase the output of each bit counter in the multi-bit counter becomes insufficient, and the frequency of the clock signal that can be used for the conventional multi-bit counter is restricted.

SUMMARY OF THE INVENTION

One aspect of the present invention provides a multi-bit counter capable of high-speed operation by presetting all bit combinations for a unit having multiple bits and selecting the preset combinations by using a clock signal.

In accordance with an aspect of the present invention, there is provided a multi-bit counter comprising a multiplicity of unit counters, each for receiving bit combinations of a unit external address signal, setting an external input by a count set signal and increasing bits by a count increase signal and a carry to output an internal address signal and a final state signal; and a plurality of logically combining means, each for combining the carry and the final state signal of each unit counter, for applying the combined signal to the carry of the next unit counter, the unit counter including: a NAND gate for NAND-operating the count increase signal and a carry to output an increase control signal; a first inverter for inverting the output of the NAND gate to output an increase control signal; a multiplicity of state controlling units, each receiving the bit combinations of the unit external address signal to output a number of state signals; a multiplicity of state units for presetting possible states for the bit combinations of the unit external address signal by using the number of state signals from the multiplicity of state controlling units to selectively output the bit combinations as a plurality of internal address signals; and second to fifth inverters, the input of the second inverter coupled to the output of the third inverter and the input of the third inverter coupled to the output of the second inverter, the input of the fourth inverter coupled to the output of the fifth inverter and the input of the fifth inverter coupled to the output of the fourth inverter, for latching the plurality of internal address signals selectively output by the number of state units.

BRIEF DESCRIPTION OF THE DRAWINGS

The above and other objects and features of the instant invention will become apparent from the following description of preferred embodiments taken in conjunction with the accompanying drawings, in which.

DESCRIPTION OF THE SPECIFIC EMBODIMENTS

Preferred embodiments of the present invention will now be described in detail with reference to the accompanying drawings.

Figure 1:
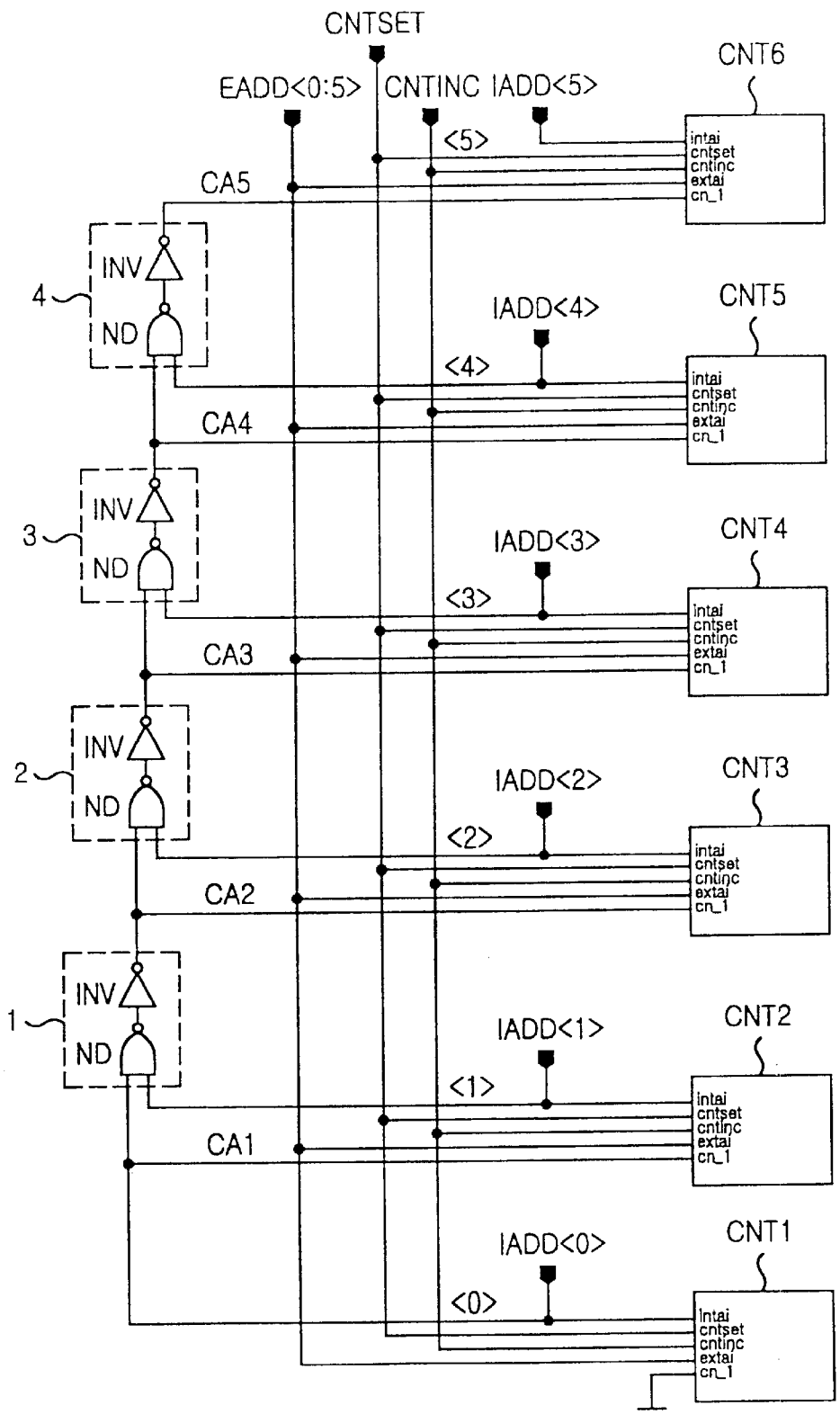
FIG. 1 is a block diagram of a typical 6-bit counter.
Figure 2:
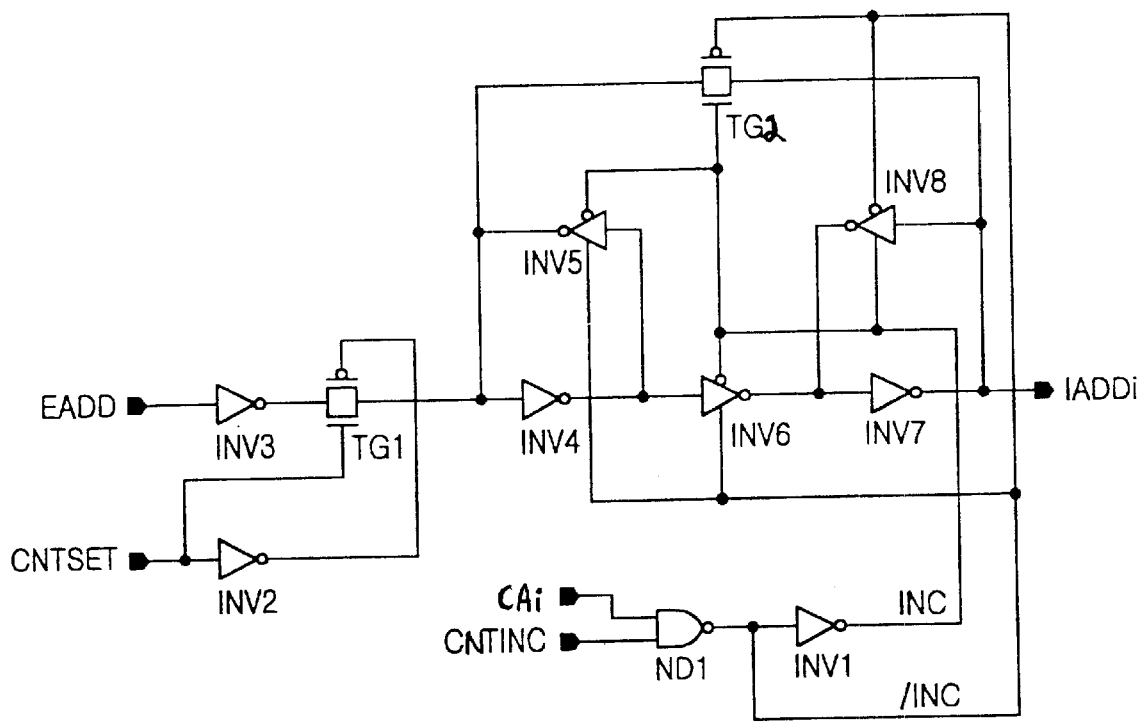
FIG. 2 is a detailed circuit diagram of a unit counter in FIG. 1.
Figure 3:
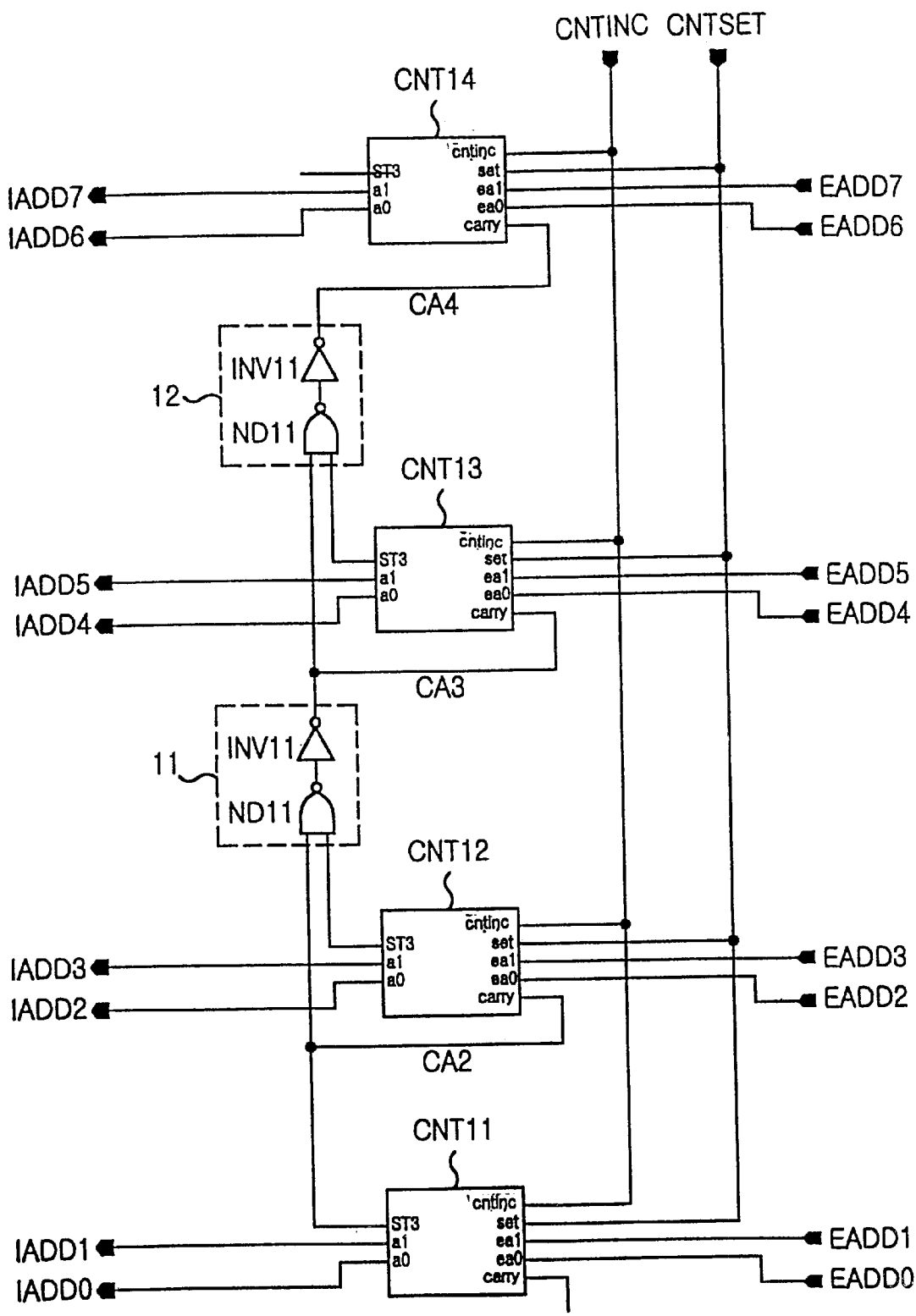
FIG. 3 is a block diagram of a multi-bit counter in accordance with the present invention.

FIG. 3 is a block diagram of a multi-bit counter of the present invention, which is an 8-bit counter having two bit sets as an example. As shown in FIG. 3, the multi-bit counter comprises first to fourth unit counters CNT11–CNT14 for detecting an initial input value by external address signals EADD<0:7>, setting an external input by a count set signal CNTSET and increasing a count increase signal CNTINC and a carry CAi to generate internal address signal IADD<0:7> and final state signals STn; and first and second carry generators 11, 12 for combining the carry of the unit counters CAi and final state signal ST3 to apply the combined signal to carry CA (i+1) of the next unit counter.

Each of the carry generators 11, 12 includes a NAND gate ND11 for NAND-operating the carry CA(i−1) of the previous unit counter CNT(i−1) and final state signal ST3, and an inverter INV11 for inverting the output of NAND gate ND11 to output the carry CAi. Here, because the carry input port of first unit counter CNT11 is coupled to a power voltage, final state signal ST3 is directly applied to carry CA2 of second unit counter CNT12.

Figure 4:
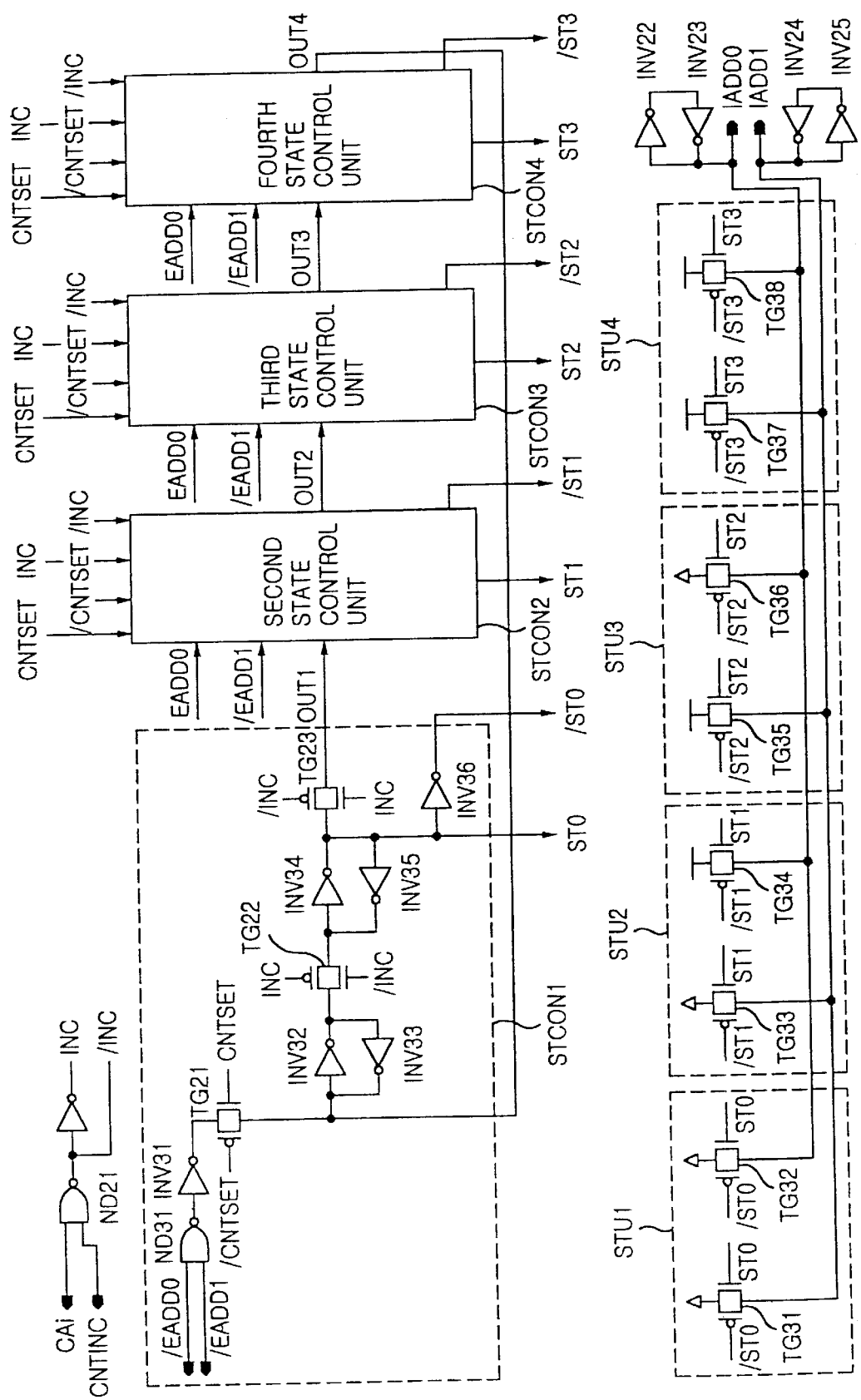
FIG. 4 is a detailed circuit diagram of a first embodiment of a unit counter in FIG. 3.

FIG. 4 provides a detailed circuit diagram of a first embodiment of a first unit counter CNT11, which includes a NAND gate ND21 for NAND-operating the count increase signal CNTINC and the carry (because first counter CNT11 is shown, the carry is power voltage level VCC) to output an inverted increase control signal /INC; a first inverter IVN21 for inverting the output signal of NAND gate ND21 to output an increase control signal INC; first to fourth state control units STCON1–STCON4 for receiving the combination of first and second external address signals EADD0, EADD1 to output first to fourth state signals ST0–ST3; first to fourth state units STU1–STU4 for presetting all bit combinations for a unit constructed by two count bits of first to fourth state signals ST0–ST3 of first to fourth state control units STCON1–STCON4 and selectively outputting each combination as first and second internal address signals IADD0, IADD1 second and third inverters IVN22, INV23, the input of the second inverter coupled to the output of the third inverter and the input of the third inverter coupled to the output of the second inverter, for latching first and second internal address signals IADD0, IADD1 selectively output by first to fourth state units STU1–STU4; and fourth and fifth inverters INV24, INV25, the input of the fourth inverter, for latching first and second internal address signals IADD0, IADD1 selectively output by first to fourth state units STU1–STU4.

Output signal OUT4 of fourth state control unit STCON4 is fed back to an input of first state control unit STCON1.

First state control unit STCON1 includes a NAND gate ND31 for NAND-operating inverted first external address signal /EADD0 and inverted second external address signal /EADD1; a first inverter INV31 for inverting the output signal of NAND gate ND31; a first transfer gate TG21 for selectively transferring the output signal of first inverter INV31 under control of count set signal CNTSET and inverted count set signal /CNTSET; second and third inverters INV32, INV33, the input of the second inverter coupled to the output of the third inverter and the input of the third inverter coupled to the output of the second inverter, for latching the signal selectively transferred through first transfer gate TG21, a second transfer gate TG22 for selectively transferring the output signal of second inverter INV32 under control of increase control signal INC and inverted increase control signal /INC; fourth and fifth inverters INV34, INV35, the input of the fourth inverter coupled to the output of the fifth inverter and the input of the fifth inverter coupled to the output of the fourth inverter, for latching the signal selectively transferred through second transfer gate TG22 to output first state signal ST0; a sixth inverter INV36 for inverting first state signal ST0 to output inverted state signal /ST0; and a third transfer gate TG23 for selectively transferring the output signal of fourth inverter INV34 under control of inverted increase control signal /INC and increase control signal INC to output an output signal OUT1.

First state unit STU1 includes first and second transfer gates TG31, TG32 for selectively transferring the ground voltage VSS under control of inverted first state signal /ST0 and first state signal ST0, and second state unit STU2 includes third and fourth transfer gates TG33, TG34 for selectively transferring, respectively, ground voltage VSS and power voltage VCC under control of inverted second state signal /ST1 and second state signal ST1. Third state unit STU3 includes fifth and sixth transfer gates TG35, TG36 for selectively transferring, respectively, power voltage VCC and ground voltage VSS under control of inverted third state signal /ST2 and third state signal ST2; and fourth state unit STU4 includes seventh and eighth transfer gates TG37, TG38 for selectively transferring power voltage VCC under control of inverted fourth state signal /ST3 and fourth state signal ST3.

Figure 5:
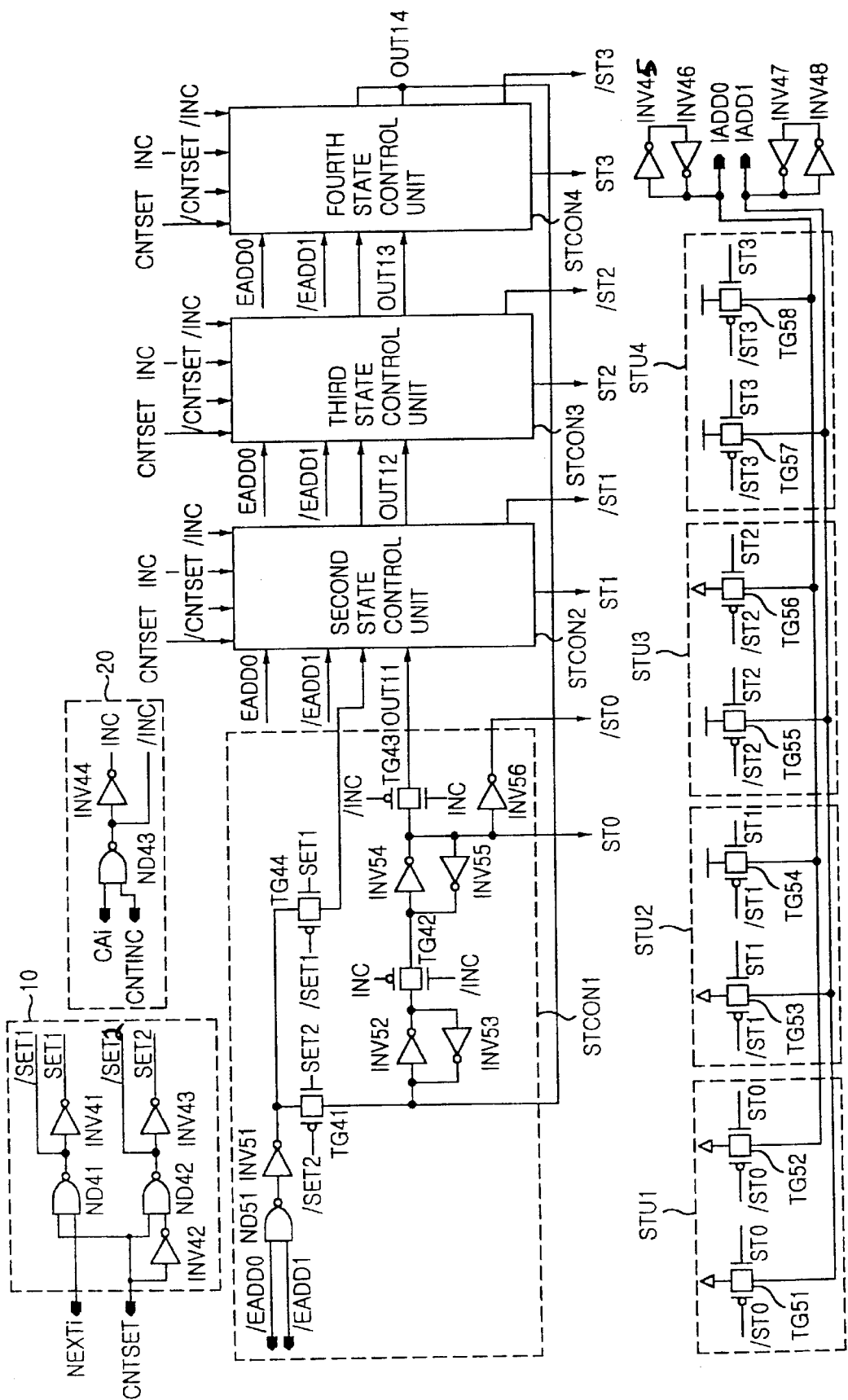
FIG. 5 is a detailed circuit diagram of a second embodiment of the unit counter in FIG. 3.

FIG. 5 represents a detailed circuit diagram of a second embodiment of the first unit counter CNT11, which includes a set control unit 10 having a first NAND gate ND41 for NAND-operating a propagating signal NEXTi and count set signal CNTSET to output an inverted first set signal /SET1; a first inverter 1NV41 for inverting the output of first NAND gate ND41 to output a first set signal SET1; a second inverter INV42 for inverting the propagating signal NEXTi; a second NAND gate ND42 for NAND-operating the output of second inverter INV42 and count set signal CNTSET to output an inverted second set signal /SET2; and a third inverter INV43 for inverting the output of second NAND gate ND42 to output a second set signal SET2; an increase control unit 20 having a third NAND gate ND43 for NAND-operating the CAi and count increase signal CNTINC to output an inverted increase control signal /INC; and a fourth inverter INV44 for inverting the output of third NAND gate ND43 to output an increase control signal INC; first to fourth state control units STCON1–STCON4 receiving a combination of first and second external address signals EADD0, EADD1 to output first to fourth state signals ST0–ST3; first to fourth state units STU1–STU4 for presetting all bit combinations for a unit constructed by two count bits of first to fourth state control units STCON1–STCON4 and for selectively outputting each combination as internal address signals IADD0, IADD1; fifth and sixth inverters INV45, INV46, and seventh and eighth inverters INV47, INV48, the input of the fifth inverter coupled to the output of the sixth inverter and the input of the sixth inverter coupled to the output of the fifth inverter, the input of the seventh inverter coupled to the output of the eighth inverter and the input of the eighth inverter coupled to the output of the seventh inverter, for latching first and the second internal address signals IADD0, IADD1 selectively output by first to fourth state units STU1–STU4.

Output signal OUT14 of the fourth state control unit STCON4 is fed back to an input of first state control unit STCON1.

First state control unit STCON1 includes a NAND gate ND51 for NAND-operating inverted first external address signal /EADD0 and inverted second external address signal /EADD1; a first inverter INV51 for inverting the output of NAND gate ND51; a first transfer gate TG41 for selectively transferring the output signal of first inverter INV51 under control of the inverted second set signal /SET2 and the second set signal SET2; second and third inverters INV52, INV53, the input of the second inverter coupled to the output of the third inverter and the input of the third inverter coupled to the output of the second inverter, for latching the signal selectively transferred through first transfer gate TG41; a second transfer gate TG42 for selectively transferring the output of second inverter INV52 under control of inverted increase control signal /INC; fourth and fifth inverters INV54, INV55, the input of the fourth inverter coupled to the output of the fifth inverter and the input of the fifth inverter coupled to the output of the fourth inverter, for latching the signal selectively transferred through second transfer gate TG42; a sixth inverter INV56 for inverting the output signal of fourth inverter INV54 to output inverted first state signal /ST0; a third transfer gate TG43 for selectively transferring the output of fourth inverter INV54 under control of inverted increase control signal /INC and increase control signal INC to output the output signal OUT11; and a fourth transfer gate TG44 for selectively transferring the output of first inverter INV51 under control of inverted first set signal /SET1 and first set signal SET1.

The configuration for second to the fourth state control units STCON2–STCON4 is similar to that of first state control unit STCON1, in which the signal transferred through fourth transfer gate TG44 of the previous state and output signal OUT11 of the previous stage are applied.

First state unit STU1 includes first and second transfer gates TG51, TG52 for selectively transferring ground voltage VSS under control of inverted first state signal /ST0 and first state signal ST0, respectively, and second state unit STU2 includes third and fourth transfer gates TG53, TG54 for selectively transferring ground voltage VSS and power voltage VCC under control of inverted second state signal /ST1 and second state signal ST1, respectively. Third state unit STU3 includes fifth and sixth transfer gates TG55, TG56 for selectively transferring power voltage VCC and ground voltage VSS under control of inverted third state signal /ST2 and third state signal ST2, respectively; and fourth state unit STU4 includes seventh and eighth transfer gates TG57, TG58 for selectively transferring power voltage VCC under control of inverted fourth state signal /ST3 and fourther state signal ST3, respectively.

Figure 6:
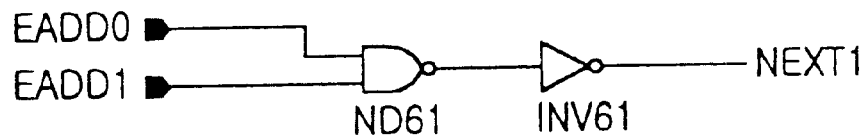
FIG. 6 is a detailed circuit diagram of a carry adder for generating a propagating signal in FIG. 5.
Figure 6:
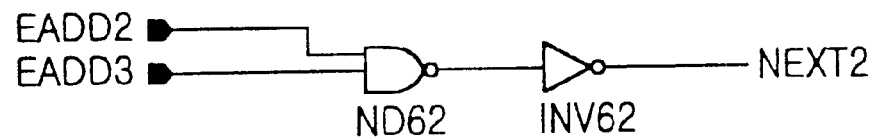
Figure 6:
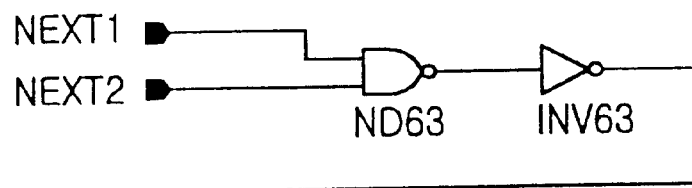
Figure 6:
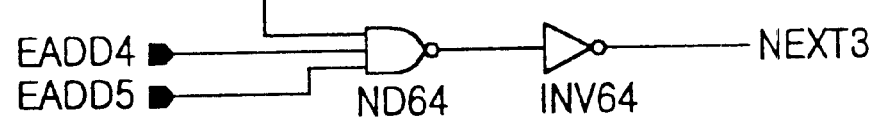
Figure 6:
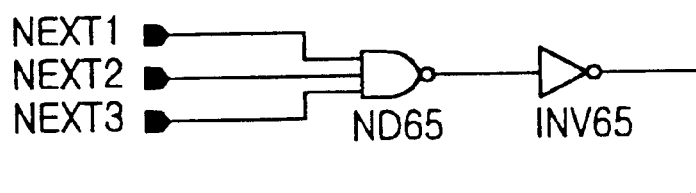
Figure 6:
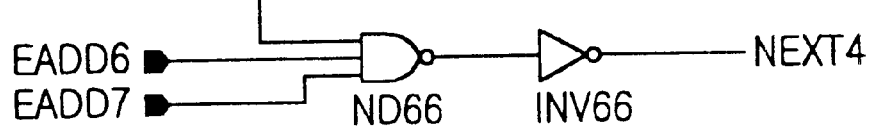

FIG. 6 is a detailed circuit diagram of a carry adder 30 for generating a propagating signal NEXTi, which includes a first NAND gate ND61 for NAND-operating first and second external address signals EADD0, EADD1; a first inverter INV61 for inverting the output of first NAND gate ND61 to output a first propagating signal NEXT1; a second NAND gate ND62 for NAND-operating third and fourth external address signals EADD2, EADD3; a second inverter INV62 for inverting the output of second NAND gate ND62 to output a second propagating signal NEXT2; a third NAND gate ND63 for NAND-operating first and second propagating signals NEXT1, NEXT2; a third inverter INV63 for inverting the output signal of third NAND gate ND63; a fourth NAND gate ND64 for NAND-operating the output of third inverter INV63 and fifth and sixth external address signals EADD4, EADD5; a fourth inverter INV64 for inverting the output of fourth NAND gate ND64 to output a third propagating signal NEXT3; a fifth NAND gate ND65 for NAND-operating first to third propagating signals NEXT1–NEXT3; a fifth inverter INV65 for inverting the output of fifth NAND gate ND65; a sixth NAND gate ND66 for NAND-operating the output of fifth inverter INV65 and seventh and eighth external address signals EADD6, EADD7; and a sixth inverter INV66 for inverting the output of sixth NAND gate ND66 to output a fourth propagating signal NEXT4.

In the 8-bit counter of the present invention as described above, all bit combinations for the unit are made up of two or more bits. The bits are preset and each combination is controlled to be selected. Therefore, the present invention is capable of high-speed operation because the time needed to increase the count value and to add the carry from each counter bit can be minimized.

First, the external address value is input to detect the initial input value to the input of the counter. Then the count set signal CNTSET for setting the external input and the count increase signal CNTINC for increasing each counter bit are input. At that time, the carry of a lower bit set is also input except for the lowest bit set.

In the embodiment described above, each of the state units STU1–STU4 is constructed using a typical 4 bit shift register, as an example, in which only one bit is made high (or low) by an initial count set signal CNTSET. The register to be set high is determined by the external address signal. Alternatively, the register can be set to output a value that is one step higher than the external address signal.

Figure 7:
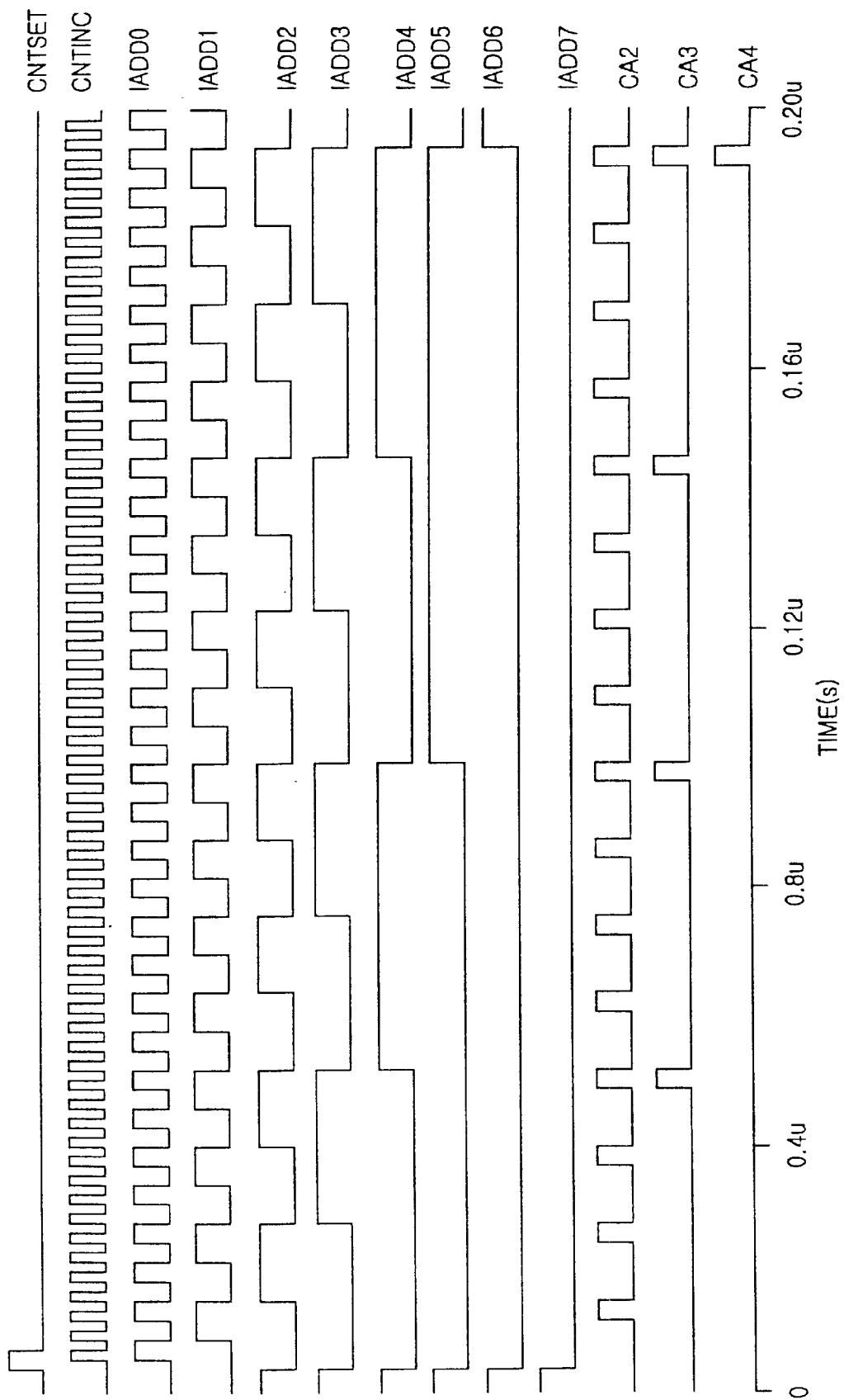
FIG. 7 is a timing diagram for operation of the block diagram in FIG. 3.

FIG. 7 is a simulation result for the operation of the multi-bit counter of the present invention, where the clock signal frequency is set at 333 MHz.

Figure 8:
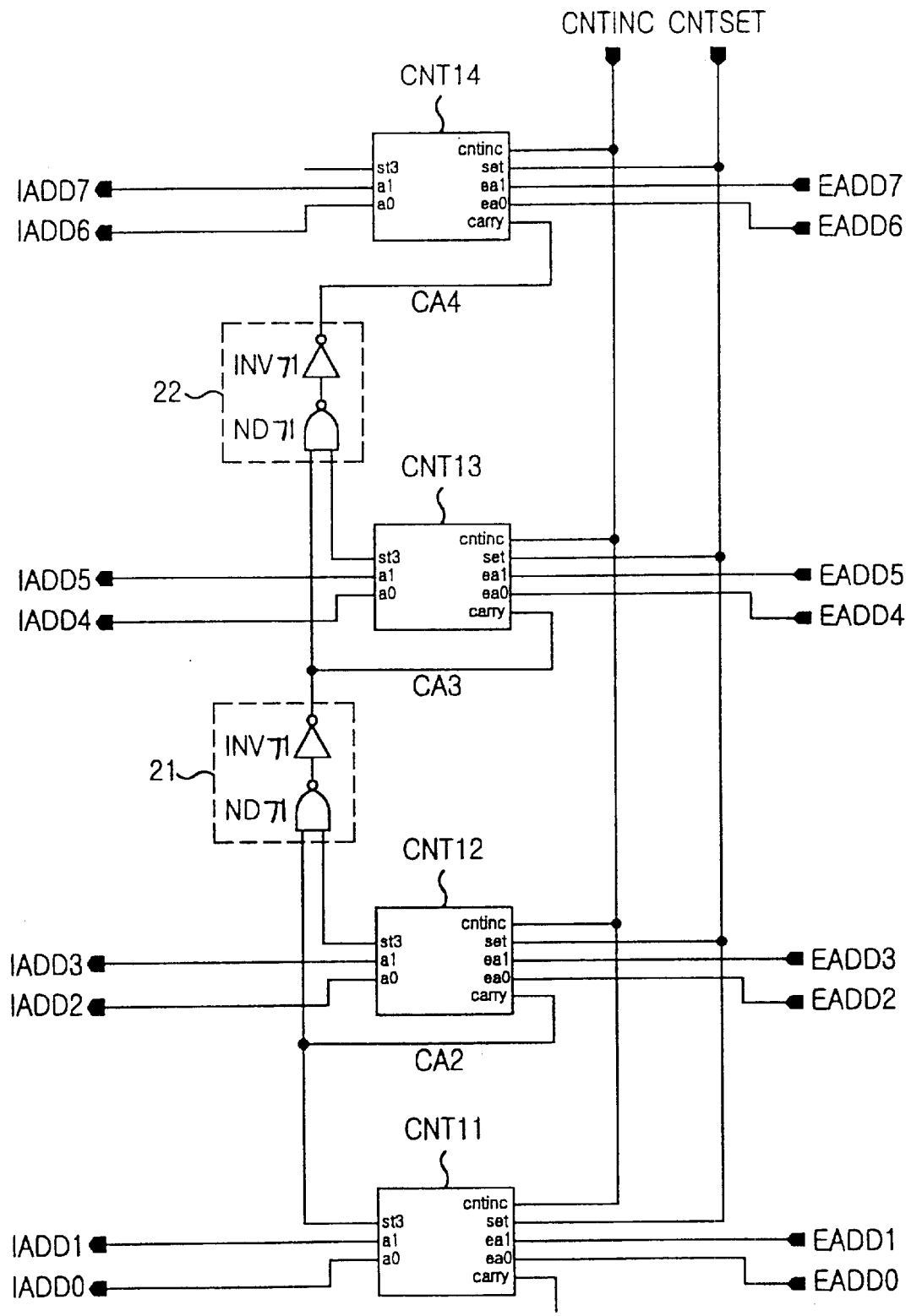
FIG. 8 is a block diagram of another embodiment of the multi-bit counter in accordance with the present invention.

FIG. 8 is a block diagram of another embodiment of the multi-bit counter in accordance with the present invention, where carry generators 21, 22 are different from other embodiments of the multi-bit counter as described above.

In this embodiment, each of the carry generators 21, 22 includes a AND gate ND71 for NAND-operating the final state signals of all unit counters and an inverter INV71 for inverting the output of NAND gate ND71 to generate the carry CAi.

The operation of the embodiment of the multi-bit counter of the present invention shown in FIG. 8 is similar to that of the other embodiments.

As described above, the present invention is capable of high-speed operation by presetting all bit combinations for the unit constructed by multiple bits and selecting each preset combination.

While the present invention has been shown and described with respect to the particular embodiments, it will be apparent to those skilled in the art that many changes and modifications may be made without departing from the spirit and scope of the invention as defined in the appended claims.

What is claimed is:

1. A multi-bit counter comprising a multiplicity of unit counters, each for receiving bit combinations of a unit external address signal, setting an external input by a count set signal and increasing bits by a count increase signal and a carry to output an internal address signal and a final state signal; and a plurality of logical combining means, each for combining the carry and the final state signal of each unit counter to apply the combined signal to the carry of a next unit counter, the unit counter including:
  a first NAND gate for NAND-operating the count increase signal and the carry to output an inverted increase control signal;

a first inverter for inverting the output of the first NAND gate to output an increase control signal;

a multiplicity of counting means, each receiving the bit combinations of the unit external address signal to output a number of state signals;

a multiplicity of state means for presetting all possible bit combinations of the unit external address signal and selectively outputting bit combinations as a plurality of internal address signals in response to the state signals outputted from the multiplicity of counting means; and a second to a fifth inverter, an input of the second inverter coupled to an output of the third inverter and an input of the third inverter coupled to an output of the second inverter, an input of the fourth inverter coupled to an output of the fifth inverter and an input of the fifth inverter coupled to an output of the fourth inverter, for latching the plurality of the internal address signals selectively outputted by the multiplicity of the state means.

2. The multi-bit counter of claim 1, wherein each of the counting meanscomprises:

a second NAND gate for NAND-operating the inverted unit external address signal;

a sixth inverter for inverting the output of the second NAND gate;

a first transfer gate for selectively transferring the output of the sixth inverter under control of the count set signal and an inverted count set signal;

a seventh and an eighth inverter, the input of the seventh inverter coupled to the output of the eighth inverter and the input of the eighth inverter coupled to the output of the seventh inverter, for latching the signal selectively transferred through the first transfer gate;

a second transfer gate for selectively transferring the output of the seventh inverter under control of the, increase control signal and the inverted increase control signal;

a ninth and a tenth inverter, the input of the ninth inverter coupled to the output, of the tenth inverter and the input of the tenth inverter coupled to the output of the ninth inverter forlatching the signal selectively transferred through the second transfer gate to the output the state signal;

an eleventh inverter for inverting the state signal to and a third transfer gate for selectively transferring the output signal of the ninth inverter under control of the inverted increase control signal and the increase control signal to output an output signal, wherein an output signal of the last one of the counting means is fed back to an input of the first one of the counting means.

3. The multi-bit counter of claim 1, wherein each of the state means includes a number of transfer gates for selectively transferring the combined state under control of the inverted state signal and the state signal.

4. The multi-bit counter of claim 1, further including carry generating means comprising:

a second NAND gate for NAND-operating the carry of the previous unit counter and the final state signal; and a sixth inverter for inverting the output of the second NAND gate to output the carry, wherein the carry input port of the first unit counter is coupled to a power voltage so that the final state signal of the first unit counter is directly applied to the carry of the next unit counter.

5. A multi-bit counter comprising a multiplicity of unit counters, each for receiving bit combinations of a unit external address signal, setting an external input by a count set signal and increasing bits by a count increase signal and a carry to output an internal address signal and a final state signal; and a plurality of logical combining means, each for combining the carry and the final state signal of each unit counter to apply the combined signal to the carry of a next unit counter, the unit counter including:

set controlling means receiving a plurality of propagating signals and a count set signal to output a multiplicity of set signals;

increasing controlling means receiving a carry of a previous stage and a count increase signal to output a number of increase control signal;

a multiplicity of counting means, each receiving the bit combinations of the unit external address signal to output a number of state signals;

a multiplicity of state means for presetting all possible bit combinations of the unit external address signal and selectively outputting bit combinations as a plurality of internal address signals in response to the state signals outputted from the multiplicity of counting means; and a second to a fifth inverter, an input of the second inverter coupled to an output of the third inverter and an input of the third inverter coupled to an output of the second inverter, an input of the fourth inverter coupled to an output of the fifth inverter and an input of the fifth inverter coupled to an output of the fourth inverter, for latching the plurality of the internal address signals selectively outputted by the multiplicity of the state means.

6. The multi-bit counter of claim 5, wherein each of the counting means comprises:

a NAND gate for NAND-operating the inverted unit external address signal;

a sixth inverter for inverting the output of the NAND gate;

a first transfer gate for selectively transferring the output of the sixth inverter under control of an inverted second set signal and the second set signal;

a seventh and an eighth inverter, the input of the seventh inverter coupled to the output of the eighth inverter and the input of the eighth inverter coupled to the output of the seventh inverter, for latching the signal selectively transferred through the first transfer gate;

a second transfer gate for selectively transferring the output of the seventh inverter under control of the increase control signal and an inverted increase control signal;

a ninth and a tenth inverter, the input of the ninth inverter coupled to the output of the tenth inverter and the input of the tenth inverter coupled to the output of the ninth inverter, for latching the signal selectively transferred through the second transfer gate to output the first state signal;

an eleventh inverter for inverting the output of the ninth inverter to output an inverted first state signal;

a third transfer gate for selectively transferring the output signal of the fourth inverter under control of the inverted increase control signal and the increase control signal to output an output signal; and a forth transfer gate for selectively transferring the output of the first inverter under control of an inverted first set signal and the first set signal;

wherein the signal selectively transferred through the fourth transfer gate of the previous stage and the output signal of the previous stage are applied, and the output signal of the last one of the counting means is fed back to an input of the first one of the counting means.

7. The multi-bit counter as recited in claim 5, wherein each of the state means comprises a number of transfer gates for selectively transferring the combined states, under control of the inverted state signal and the state signal.

8. The multi-bit counter as recited in claim 5, further including carry generating means comprising:
   a NAND gate for NAND-operating the carry and the final state signal of the previous unit counter; and
   a sixth inverter for inverting the output of the NAND gate to output the carry,
   wherein the carry input port of the first unit counter is coupled to a power voltage so that the final state signal of the first unit counter is directly applied to the carry of the next unit counter.

9. The multi-bit counter as recited in claim 5, wherein one of the propagating signals is output from a carry adding means, the carry adding means comprising:
   a first NAND gate for NAND-operating a first and a second external address signal;
   a sixth inverter for inverting the output of the first NAND gate to output a first propagating signal;
   a second NAND gate for NAND-operating a third and a fourth external address signal;
   a seventh inverter for inverting the output of the second NAND gate to output a second propagating signal;
   a third NAND gate for NAND-operating the first and second propagating signals;
   an eighth inverter for inverting the output of the third NAND gate;
   a fourth NAND gate for NAND-operating the output of the eighth inverter and a fifth and a sixth external address signal;
   a ninth inverter for inverting the output of the fourth NAND gate to output a third propagating signal;
   a fifth NAND gate for NAND-operating the first to the third propagating signals;
   a tenth inverter for inverting the output of the fifth NAND gate;
   a sixth NAND gate for NAND-operating the output of the tenth inverter and seventh and eighth external address signals; and
   an eleventh inverter for inverting the output of the sixth NAND gate to output a fourth propagating signal.

10. The multi-bit counter as recited in claim 5, wherein the set controlling means comprises:
    a first NAND gate for NAND-operating the propagating signals and the count set signal to output an inverted first set signal;
    a sixth inverter for inverting the output of the first NAND gate to the first set signal;
    a seventh inverter for inverting the plurality of propagating signals;
    a second NAND gate for NAND-operating the output of the seventh inverter and the count set signal to output the second set signal; and
    a eighth inverter for inverting the output of the second NAND gate to output the second set signal.

11. The multi-bit counter as recited in claim 5, wherein the increase controlling means includes:
    a NAND gate for NAND-operating the count increase signal and the carry to output the inverted increase control signal; and
    a sixth inverter for inverting the output signal of the NAND gate to output the increase control signal.

12. A multi-bit counter having a plurality of counter units, the multi-bit counter comprising:
    a first counter unit having a first input for receiving a first external address signal, a second input for receiving a second external address signal, a third input for receiving a count set signal, a fourth input for receiving a count increase signal and a fifth input for receiving a carry signal, a first output for providing a first internal address signal, a second output for providing a second internal address signal and a third output for providing a first final state signal;
    a carry generator circuit having a first input for receiving the first final state signal of the first unit counter, a second input coupled to the fifth input of the first counter unit, an output for providing a combined carry signal; and
    a second counter unit having a first input for receiving a third external address signal, a second input for receiving a fourth external address signal, a third input for receiving the count set signal, a fourth input for receiving the count increase signal, a fifth input for receiving the combined carry signal from the carry generator circuit, a first output for providing a third internal address signal, a second output for a fourth internal address signal and a third output for providing a second final state signal.

13. The multi-bit counter of claim 12 wherein, the first counter unit comprises:
    a first logic gate for receiving the count increase signal and the carry signal to output an inverted increase control signal; and
    a first inverter for inverting the output of the first logic gate to output an increase control signal.

14. The multi-bit counter of claim 13 wherein, the first counter unit further comprises:
    at least one state control unit for receiving one or more external address signals to provide one or more state signal outputs.

15. The multi-bit counter of claim 14 wherein, the first counter unit further comprises:
    at least one state unit for presetting all possible bit combinations of the external address signal and selectively outputting bit combinations of an internal address signal.

16. The multi-bit counter of claim 15 wherein, the first counter unit further comprises:
    a second inverter; and
    a third inverter, wherein the second inverter has an input coupled to an output of the third inverter, wherein the third inverter has an input coupled to an output of the second inverter, wherein the input of the second inverter is for receiving one or more internal address signals.

17. The multi-bit counter of claim 16 wherein, the first counter unit further comprises:
    a fourth inverter; and
    a fifth inverter, wherein the fourth inverter has an input coupled to an output of the fifth inverter, wherein the fifth inverter has an input coupled to an output of the fourth inverter, and wherein the input of the fourth inverter is for receiving one or more internal address signals.

18. A counter circuit comprising:
a first logic circuit for receiving a count increase signal and a carry signal to output an increase control signal and an inverted increase control signal;
a state control unit for receiving a count set signal, a first external address signal and a second address signal to output a state signal and an inverted state signal, wherein the count set signal, the increase control signal and the inverted increase control signal are configured to selectively output the state signal and the inverted state signal; and
a state unit for presetting all possible bit combinations of the first external address signal and the second external address signal to selectively output bit combinations of a first internal address signal and a second internal address signal, wherein the state signal and the inverted state signal are configured to selectively output said bit combinations of the internal address signals.

19. The counter circuit of claim 18, wherein the first logic circuit comprises:
a logic gate for receiving the count increase signal and the carry signal to output an inverted increase control signal; and
a first inverter for inverting the output of the logic gate to output the increase control signal.

20. The counter circuit of claim 19 further comprising:
a second logic circuit comprising
a second inverter; and
a third inverter, wherein the second inverter has an input coupled to an output of the third inverter, wherein the third inverter has an input coupled to an output of the second inverter, wherein the input of the second inverter is for receiving one or more internal address signals.

21. The counter circuit of claim 20 further comprising:
a third logic circuit comprising
a fourth inverter; and
a fifth inverter, wherein the fourth inverter has an input coupled to an output of the fifth inverter, wherein the fifth inverter has an input coupled to an output of the fourth inverter, wherein the input of the fifth inverter is for receiving at least one internal address signal.

22. The counter circuit of claim 18, wherein the state control unit comprises:
a logic gate for receiving an inverted first external address signal and an inverted second external address signal to provide an output signal;
a first inverter for inverting said output signal of the logic gate;
a first transfer gate for selectively transferring an output signal of the first inverter under control of a count set signal and an inverted count set signal;
a second inverter having an input coupled to an output of a third inverter, wherein an input of the third inverter is coupled to an output of the second inverter for latching the signal selectively transferred through the first transfer gate;
a second transfer gate for selectively transferring the output signal of second inverter under control of the increase control signal and inverted increase control signal;
a fourth inverter having an input coupled to the output of a fifth inverter, wherein an input of the fifth inverter is coupled to an output of the fourth inverter, for latching a signal selectively transferred through the second transfer gate to output the state signal;
a sixth inverter for inverting the state signal to output the inverted state signal; and
a third transfer gate for selectively transferring an output signal of the fourth inverter under control of the inverted increase control signal and the increase control signal to provide an output signal.

23. The counter circuit of claim 18, wherein the state unit comprises:
a first transfer gate; and
a second transfer gate, wherein the transfer gates are for selectively transferring a ground voltage under control of the state signal and the inverted state signal.

24. A multi-bit counter comprising a multiplicity of unit counters, each for receiving bit combinations of a unit external address signal, setting an external input by a count set signal and increasing bits by a count increase signal and a carry to output an internal address signal and a final state signal, and a plurality of logical circuits, each for combining the carry and the final state signal of each unit counter to apply the combined signal to a carry of a next unit counter, the unit counter including:
a logic gate for receiving the count increase signal and the carry to output an inverted increase control signal;
a first inverter for inverting the output of the logic gate to output an increase control signal;
a plurality of state control units, each receiving the bit combinations of the unit external address signal to output a number of state signals;
a plurality of state units for presetting all possible bit combinations of the unit external address signal and selectively outputting bit combinations as a plurality of internal address signals in response to the state signals outputted from the plurality of state control units; and
a second to a fifth inverter, an input of the second inverter coupled to an output of the third inverter and an input of the third inverter coupled to an output of the second inverter, an input of the fourth inverter coupled to an output of the fifth inverter and an input of the fifth inverter coupled to an output of the fourth inverter, for latching the plurality of the internal address signals selectively outputted by the plurality of the state units.

25. A multi-bit counter comprising a plurality of unit counters, each for receiving bit combinations of a unit external address signal, setting an external input by a count set signal and increasing bits by a count increase signal and a carry to output an internal address signal and a final state signal, and a plurality of logical circuits, each for combining the carry and the final state signal of each unit counter to apply the combined signal to a carry of a next unit counter, the unit counter including:
a set controlling unit receiving a plurality of propagating signals and a count set signal to output a multiplicity of set signals;
an increase control unit receiving a carry of a previous stage and a count increase signal to output an increase control signal;
a plurality of state control units, each receiving the bit combinations of the unit external address signal to output a number of state signals;
a plurality of state units for presetting all possible bit combinations of the unit external address signal and selectively outputting bit combinations as a plurality of internal address signals in response to the state signals outputted from the plurality of state control units; and
a second to a fifth inverter, an input of the second inverter coupled to an output of the third inverter and an input of the third inverter coupled to an output of the second inverter, an input of the fourth inverter coupled to an output of the fifth inverter and an input of the fifth inverter coupled to an output of the fourth inverter, for latching the plurality of the internal address signals selectively outputted by the multiplicity of the state units.

26. A counter circuit comprising:

a first logic circuit for receiving at least one propagating signal and a count set signal to output a one or more set signals;

a second logic circuit for receiving a carry signal and a count increase signal to output an increase control signal;

a state control unit for receiving a first external address signal and a second external address signal to output a state signal and an inverted state signal, wherein the set signal, the increase control signal and the inverted increase control signal are configured to selectively output the state signal and the inverted state signal; and a state unit for presetting all possible bit combinations of the first external address signal and the second external address signal to selectively output bit combinations of a first internal address signal and a second internal address signal, wherein the state signal and the inverted state signal are configured to selectively output said bit combinations of the internal address signals.

27. The counter circuit of claim 26 further comprising:

a first to a fourth inverter, an input of the first inverter coupled to an output of the second inverter and an input of the second inverter coupled to an output of the first inverter, an input of the third inverter coupled to an output of the fourth inverter and an input of the fourth inverter coupled to an output of the third inverter, for latching said bit combinations of the internal address signals.

* * * * *